(12) United States Patent
Lee et al.

(10) Patent No.: US 11,700,795 B2
(45) Date of Patent: Jul. 18, 2023

(54) LIGHT EMITTING DEVICE AND LIGHT APPARATUS FOR PLANT GROWTH

(71) Applicant: SAMSUNG ELECTRONICS CO., LTD., Suwon-si (KR)

(72) Inventors: Dongkuk Lee, Hwaseong-si (KR); Kunyoo Ko, Hwaseong-si (KR); Daesup Kim, Suwon-si (KR); Jaechul Kim, Yongin-si (KR); Sunhwan Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/574,149

(22) Filed: Jan. 12, 2022

(65) Prior Publication Data
US 2022/0354062 A1    Nov. 10, 2022

(30) Foreign Application Priority Data
May 4, 2021    (KR) .......................... 10-2021-057928

(51) Int. Cl.
| | | |
|---|---|---|
| A01G 7/04 | (2006.01) | |
| F21K 9/64 | (2016.01) | |
| H01L 33/50 | (2010.01) | |
| H01L 33/06 | (2010.01) | |
| H01L 33/32 | (2010.01) | |
| F21Y 115/10 | (2016.01) | |

(52) U.S. Cl.
CPC ................ *A01G 7/045* (2013.01); *F21K 9/64* (2016.08); *H01L 33/06* (2013.01); *H01L 33/32* (2013.01); *H01L 33/504* (2013.01); *H01L 33/507* (2013.01); *F21Y 2115/10* (2016.08)

(58) Field of Classification Search
CPC ...................................................... A01G 7/045
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| CN | 103672493 B | 10/2015 |
| CN | 109197219 A | 1/2019 |

(Continued)

*Primary Examiner* — Andrew J Coughlin
(74) *Attorney, Agent, or Firm* — Sughrue Mion, PLLC

(57) ABSTRACT

A light emitting device for plant growth includes: a light emitting diode (LED) chip configured to emit a first light having a peak wavelength of 380 nm to 445 nm; and at least one wavelength conversion material configured to be excited by the first light, and convert the first light into a light having a peak wavelength of 500 nm to 610 nm, wherein a photosynthetic photon efficacy (PPE) of an output light emitted from the light emitting device is 3.10 μmol/J or more.

12 Claims, 14 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,497,973 B2 * | 3/2009 | Radkov ............. C09K 11/7777 |
| | | 313/503 |
| 7,501,656 B2 | 3/2009 | Han et al. |
| 7,648,649 B2 * | 1/2010 | Radkov ............. C09K 11/7768 |
| | | 313/503 |
| 7,709,857 B2 | 5/2010 | Kim et al. |
| 7,737,457 B2 * | 6/2010 | Kolodin ............... H01L 33/501 |
| | | 257/E33.061 |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,312,249 B2 * | 4/2016 | Choi ....................... H01L 33/08 |
| 10,141,483 B2 | 11/2018 | Baur et al. |
| 10,458,605 B2 | 10/2019 | Ting et al. |
| 10,727,377 B2 | 7/2020 | Wang et al. |
| 2002/0030292 A1 * | 3/2002 | Tasaki ................... H01L 33/507 |
| | | 264/21 |
| 2006/0006820 A1 * | 1/2006 | Roseman ................ A01G 7/045 |
| | | 315/312 |
| 2012/0274240 A1 * | 11/2012 | Lee ..................... H01L 33/0095 |
| | | 252/301.4 R |
| 2012/0311925 A1 * | 12/2012 | Aikala ................... A01G 7/045 |
| | | 47/1.41 |
| 2013/0214704 A1 * | 8/2013 | Gerlach ................. H05B 45/24 |
| | | 315/312 |
| 2014/0374780 A1 | 12/2014 | Schaefer et al. |
| 2015/0054400 A1 * | 2/2015 | Murphy .................. H01L 33/50 |
| | | 313/503 |
| 2015/0076406 A1 * | 3/2015 | Zhou .................... C09K 11/616 |
| | | 252/301.4 F |
| 2016/0064620 A1 | 3/2016 | Mastin et al. |
| 2016/0376499 A1 * | 12/2016 | Setlur ................... H01L 33/502 |
| | | 257/98 |
| 2017/0086391 A1 * | 3/2017 | Vilgiate ................... A01G 9/20 |
| 2018/0226545 A1 * | 8/2018 | He .......................... H05B 33/14 |
| 2018/0323351 A1 * | 11/2018 | Chen ..................... H01L 33/507 |
| 2019/0166774 A1 * | 6/2019 | Melis ..................... A01H 6/823 |
| 2022/0053705 A1 * | 2/2022 | Kosoburd ................. F21V 5/04 |

FOREIGN PATENT DOCUMENTS

| | | |
|---|---|---|
| CN | 106449617 B | 4/2019 |
| EP | 3 262 924 A1 | 1/2018 |
| JP | 2002-27831 A | 1/2002 |
| JP | 2019-125577 A | 7/2019 |
| JP | 6643610 B2 | 2/2020 |

* cited by examiner

LIGHT EMITTING DEVICE AND LIGHT APPARATUS FOR PLANT GROWTH

CROSS-REFERENCE TO RELATED APPLICATION

This application claims priority from Korean Patent Application No. 10-2021-0057928 filed on May 4, 2021 in the Korean Intellectual Property Office, the disclosure of which is incorporated herein by reference in its entirety.

BACKGROUND

The present disclosure relates to a light emitting device and a light apparatus for plant growth.

As a cultivation method for reducing uncertainty in food production, protected crop production such as greenhouses or plant factories have been actively increased to stably produce food by minimizing the influence of external climate. The protected crop production may not only enable continuous production throughout the year but also improve the yield and quality of crops through environmental management. In protected crop production, it is difficult to directly use sunlight in greenhouses or plant factories, and thus, it is critical to secure light required for plant growth.

As a method for securing sufficient light for plant growth, artificial light such as light emitting diode (LED) lighting has come to prominence. Such LED lighting may be implemented as a miniaturized light apparatus, while being able to select a desired specific wavelength, as well as having excellent light efficiency.

SUMMARY

Example embodiments of the disclosure provide a light emitting device emitting light having a spectrum beneficial to plant growth.

The example embodiments also provide a light apparatus for plant growth that emits light having a spectrum beneficial to plant growth.

According to example embodiments, there is provided a light emitting device for plant growth which may include: a light emitting diode (LED) chip configured to emit a first light having a peak wavelength of 380 nm to 445 nm; and at least one wavelength conversion material configured to be excited by the first light, and convert the first light into a light having a peak wavelength of 500 nm to 610 nm, wherein a photosynthetic photon efficacy (PPE) of an output light emitted from the light emitting device is 3.10 μmol/J or more.

According to example embodiments, there is provided a light emitting device for plant growth which may include: a light emitting diode (LED) chip configured to emit a blue light having a peak wavelength ranging from 430 nm to 445 nm; a first wavelength conversion material configured to be excited by the blue light, and emit a first light having a peak wavelength of 500 nm to 550 nm; and a second wavelength conversion material configured to be excited by the blue light, and emit a second light having a peak wavelength ranging from 570 nm to 610 nm, wherein an output light emitted from the light emitting device has a photosynthetic photon efficacy (PPE) of 3.10 μmol/J or more, and has color coordinates located in a region defined by (0.22, 0.29), (0.35, 0.29), (0.5, 0.43), and (0.32, 0.55) in a CIE 1931 color coordinate system.

According to example embodiments, there is provided a light apparatus for plant growth which may include: a circuit board; and a plurality of light emitting devices mounted on the circuit board, wherein each of the plurality of light emitting devices includes: a light emitting diode (LED) chip configured to emit a first light having a peak wavelength of 380 nm to 445 nm; and at least one wavelength conversion material configured to be excited by the first light, and convert the first light into a light having a peak wavelength of 500 nm to 610 nm, wherein a photosynthetic photon efficacy (PPE) of an output light emitted from each of the plurality of the light emitting devices is 3.10 μmol/J or more.

BRIEF DESCRIPTION OF DRAWINGS

The above and other aspects, features, and advantages of the embodiments will be more clearly understood from the following detailed description, taken in conjunction with the accompanying drawings, in which.

DETAILED DESCRIPTION

Hereinafter, various embodiments of the inventive concept will be described in detail with reference to the accompanying drawings. All of the embodiments described herein are example embodiments, and thus, the inventive concept is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
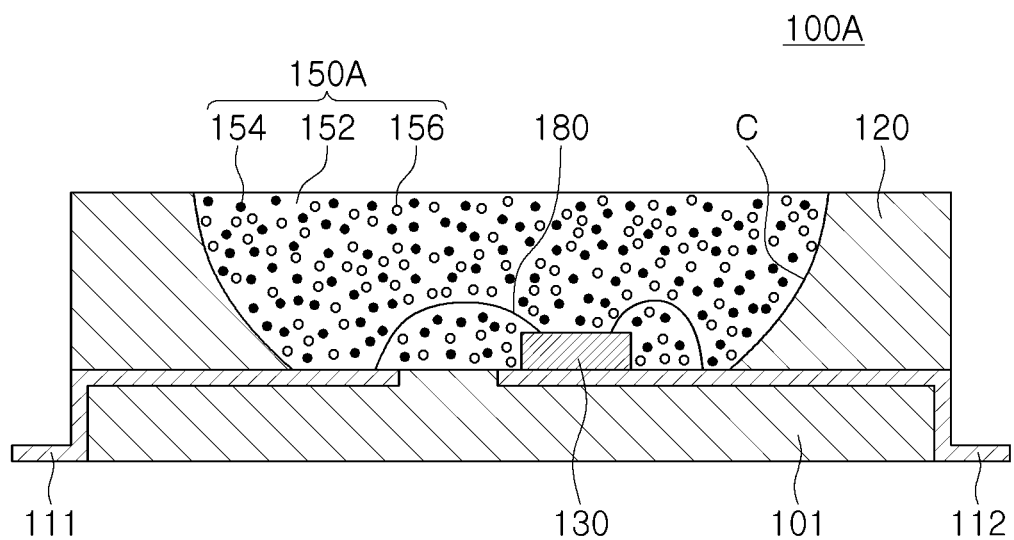
FIG. 1 is a cross-sectional view schematically illustrating a light emitting device for plant growth, according to an embodiment.

FIG. 1 is a cross-sectional view schematically illustrating a light emitting device for plant growth, according to an embodiment.

Referring to FIG. 1, a light emitting device 100A for plant growth according to the present embodiment may include a package substrate 101, a light emitting diode (LED) chip 130 and a wavelength conversion unit 150A disposed on the package substrate 101. In addition, the light emitting device 100A may include a pair of lead frames 111 and 112 electrically connected to the LED chip 130, a sidewall reflector 120 having a cup shape, a conductive wire 180 connecting the light emitting diode chip 130 to the lead frames 111 and 112.

In some embodiments, the package substrate 101 may include a resin containing highly reflective powder. The highly reflective powder may be a white powder such as titanium dioxide ($TiO_2$). In this case, the package substrate 101 may be manufactured by an injection process, and may be integrally manufactured with, for example, the sidewall reflector 120. In some embodiments, the package substrate 101 may include a ceramic substrate (e.g., aluminum nitride (AlN)) having excellent heat dissipation characteristics. In some embodiments, the package substrate 101 may be a printed circuit board such as FR4. In this case, the lead frames 111 and 112 may be a printed wiring pattern (e.g., a plating layer) as a different type of electrode structure.

The sidewall reflector 120 may be disposed on the substrate 101, and the lead frames 111 and 112, and may form a cavity C for accommodating the LED chip 130. The sidewall reflector 120 may have a cup shape having an inclined inner sidewall to improve reflection efficiency, but is not limited thereto.

The LED chip 130 may be disposed on an upper surface of the package substrate 101, and may include epitaxially grown semiconductor layers. The LED chip 130 employed in the present embodiment may be configured to emit an excitation light having a peak wavelength in a range of 380 nm to 445 nm. In some embodiments, the peak wavelength of the LED chip 130 may be in the range of 430 nm to 445 nm, and in certain embodiments, the peak wavelength of the LED chip 130 may be in a lower range of 430 nm to 440 nm.

The wavelength conversion unit 150A may be disposed on a light path of the LED chip 130. In the present embodiment, the wavelength conversion unit 150A may be disposed in a cavity C of the sidewall reflector 120. The wavelength conversion unit 150A may include an encapsulation layer 152 and a plurality of wavelength conversion materials 154 and 156 excited by excitation light contained in the encapsulation layer 152 to convert the excitation light into light having different wavelengths. The encapsulation layer 152 may be formed of a light-transmitting resin, for example, epoxy, silicone, strained silicone, urethane resin, oxetane resin, acryl, polycarbonate, polyimide, and combinations thereof. For example, at least one of the plurality of wavelength conversion materials may include a phosphor selected from among $(Ga,Gd,Y,Lu)_3Al_5O_{12}:Ce$, $La_3Si_6N_{11}:Ce$, $(Sr,Ca,Ba)Si_2O_2N_2:Eu$, $(Sr,Ba)_2SiO_4:Eu$, $(Sr,Ca)AlSiN_3:Eu$, $(Lu,Gd,Y)_3(Ga,Al)_5O_{12}:Ce$, and $\beta\text{-SiAlON:Eu}$.

The wavelength conversion material employed in the present embodiment may include a first wavelength conversion material 154 configured to convert excitation light into a first light having a peak wavelength of 500 nm to 550 nm and a second wavelength conversion material 156 configured to convert an excitation light into a second light having a peak wavelength of 570 nm to 610 nm. The light emitting device 100A for plant growth shown in FIG. 1 may combine the light converted by the first wavelength conversion material and the light converted by the second wavelength conversion material with an unconverted portion of the excitation light to emit a light (e.g., white light) for plant growth as an output light.

As such, by combining the wavelength conversion materials 154 and 156 for generating a light suitable for plant growth, while shortening the peak wavelength of the LED chip 130, a photosynthetic photon efficacy (PPE) may be significantly improved. The PPE, a luminous efficiency with respect to light for plant growth, may be understood as efficiency of a light emitting device for actual plant growth. The PPE of light emitted from the light emitting device 100A for plant growth according to the present embodiment may be 3.10 μmol/J or more, which is significantly improved compared to a level of the related art.

Figure 2:
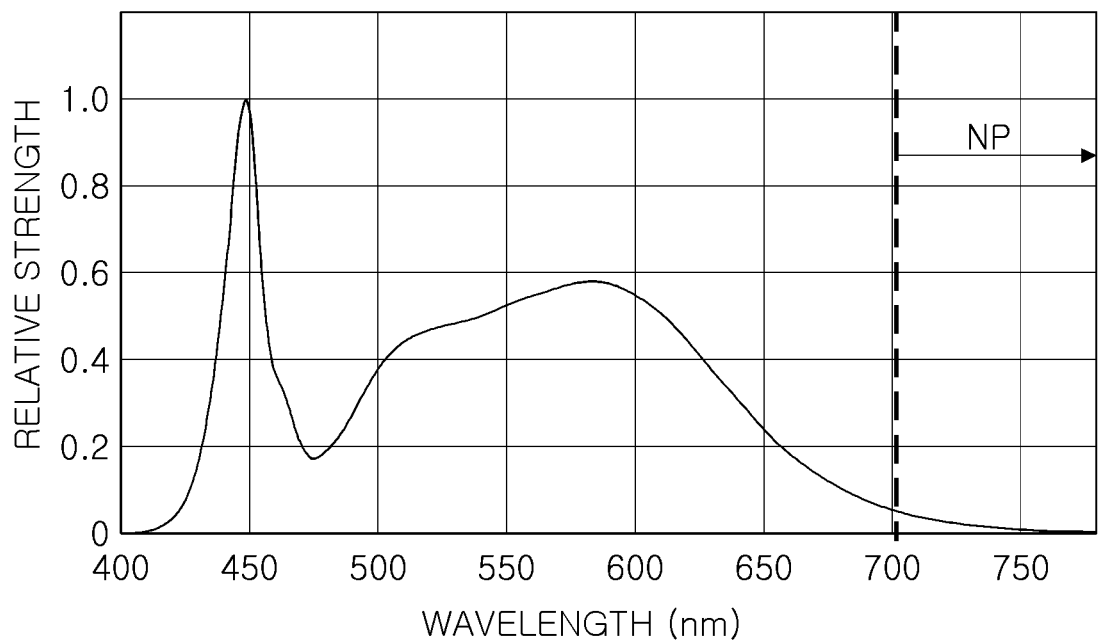
FIG. 2 illustrates a spectrum of light emitted from a light emitting device for plant growth, according to an embodiment.

FIG. 2 illustrates a spectrum of light emitted from the light emitting device 100A for plant growth shown in FIG. 1. The LED chip 130 employed in the light emitting device 100A for plant growth according to the present embodiment is configured to emit an excitation light having a peak wavelength of 435 nm, and the first and second wavelength conversion materials 154 and 156 may convert the excitation light into a light having a peak wavelength of 535 nm and a light having a peak wavelength of 599 nm, respectively.

A light emitted from the light emitting device 100A for plant growth may have an emission spectrum suitable for the growth of plants, which are photosynthetic organisms. This light is evaluated as a photosynthetic photon flux (PPF), which is defined as a total amount of light (μmol/s) in a photosynthetically active radiation (PAR) region in a light emitted every second, and the PAR region may be defined as a solar radiation spectral region ranging from 400 nm to 700 nm that photosynthetic organisms may use during photosynthesis.

Referring to FIG. 2, since the emission spectrum has a very low distribution in a wavelength band (NP) of 700 nm or more, a loss region that does not substantially contribute to photosynthesis may be significantly reduced. For example, a relative intensity at 700 nm may be 10% or less (e.g., 8%) compared to a maximum peak of the converted light band (e.g., 480 nm or greater). In this manner, a sufficiently PPF may be secured even under the condition that the wavelength of the LED chip 130 as the excitation light source is shortened to 435 nm. As can be seen in FIG. 2, a second highest peak other than the highest peak by the excitation light source may be in the range of 500 nm to 600 nm.

Meanwhile, the light emitted from the light emitting device 100A for plant growth may have a low color rendering index (CRI) unlike general lighting. For example, the CRI may be 75 or less.

In particular, in the light emitting device 100A for plant growth according to the present embodiment, the PPE may be significantly improved to 3.10 μmol/J or more by shortening the wavelength of excitation. In the present embodiment, the principle of improving a PPE through shortening of the wavelength of excitation light may be understood as follows.

First, since photons based on shortening of the wavelength have a relatively high energy level, a non-radiative recombination probability due to defects of the wavelength conversion material (e.g., phosphor) may be reduced. As a result, a conversion efficiency of the wavelength conversion materials themselves may be significantly improved.

Second, as the wavelength of blue light is shortened, the amount of use of a wavelength conversion material that requires a light of the same color coordinate may be substantially reduced. As a result, loss due to scattering in the wavelength conversion unit 150A is reduced and light transmittance is increased, so that an actual light efficiency may be improved. The efficiency improvement based on the shortening of the wavelength will be described in detail with reference to FIGS. 9 to 12.

As described above, the light emitting device for plant growth according to the present embodiment may emit light satisfying the conditions described above through a new combination of wavelength conversion materials according to the excitation light having a shorter wavelength of the LED chip. Such light may be defined as a color coordinate region.

Figure 3:
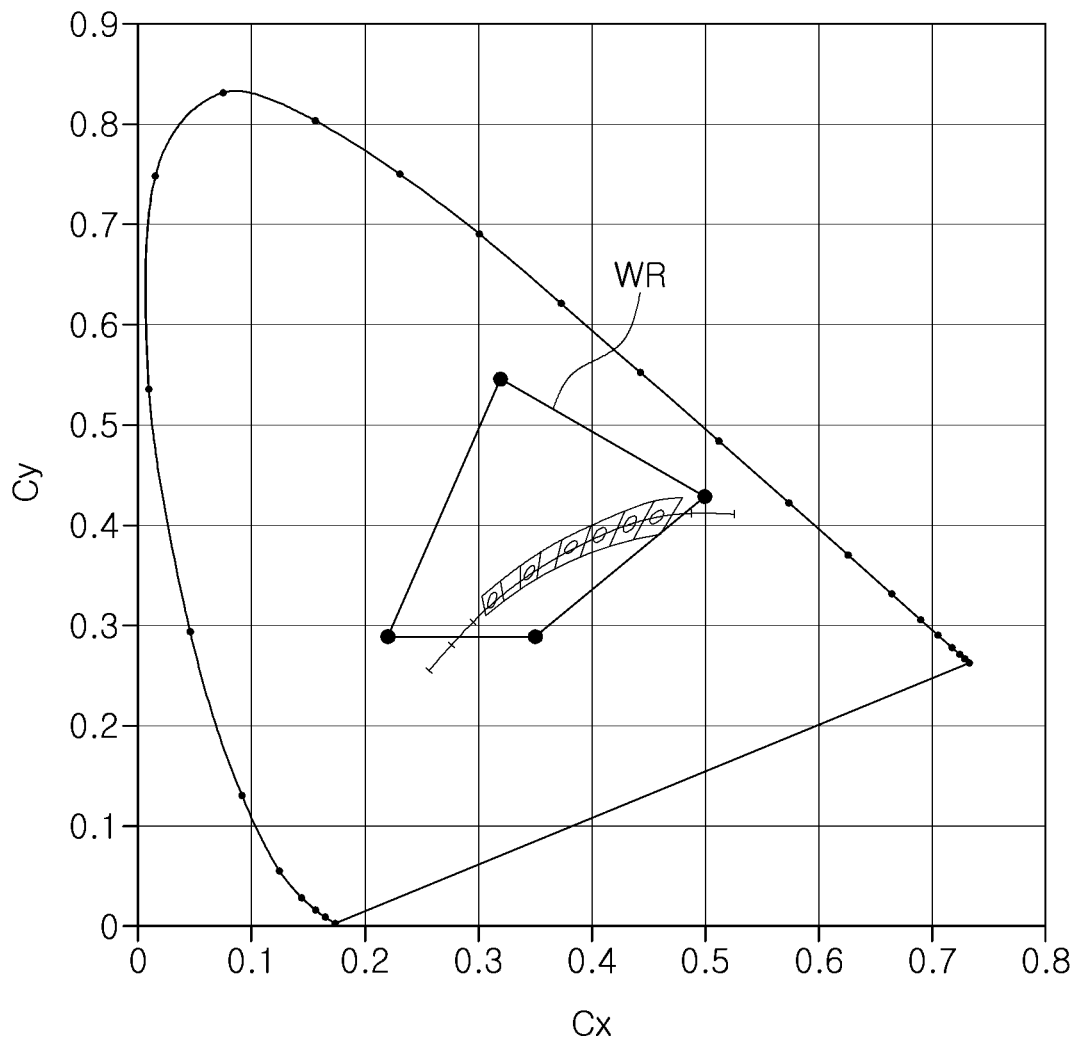
FIG. 3 is a CIE 1931 color coordinate system diagram illustrating a color coordinate region of light emitted from a light emitting device for plant growth, according to an embodiment.

FIG. 3 is a CIE 1931 color coordinate system diagram representing a color coordinate region of light emitted from a light emitting device for plant growth, according to an embodiment.

Referring to FIG. 3, a light emitted from the light emitting device 100A for plant growth may have color coordinates located in a rectangular region WR defined by (0.22, 0.29), (0.35, 0.29), (0.5, 0.43) and (0.32, 0.55). A color temperature of a light emitted from the light emitting device 100A for plant growth may be implemented to be in a wide range of 1,800K to 10,000K. In some embodiments, the color temperature may range from 4,000K to 5,500K.

In the previous embodiment, the example of using a plurality of wavelength conversion materials emitting a light having different wavelengths are used as the wavelength conversion materials, that is, the first and second wavelength conversion materials, is described, but a desired light emitting device for plant growth may be implemented using only one wavelength conversion material (e.g., a phosphor), rather than a plurality of wavelength conversion materials. Such an embodiment is shown in FIG. 4.

Figure 4:
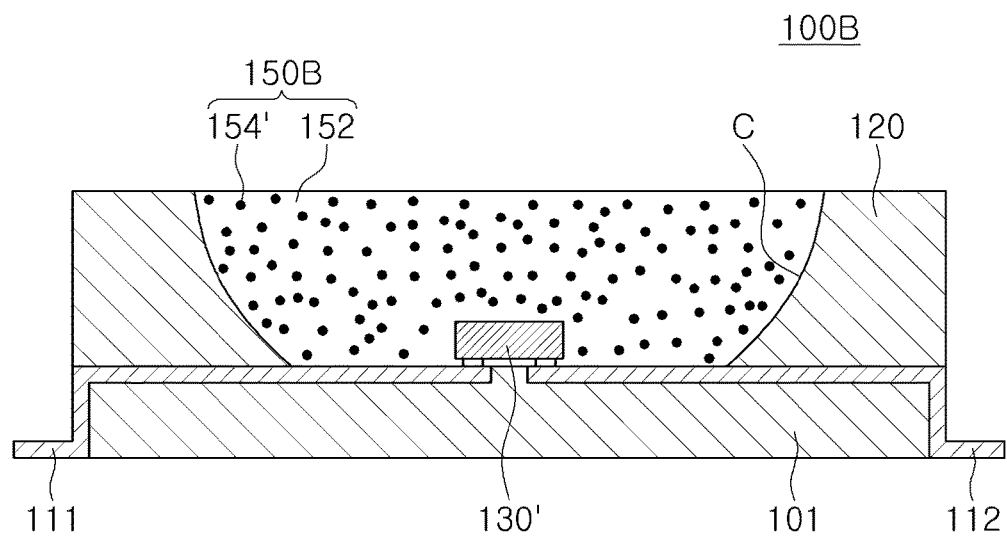
FIG. 4 is a cross-sectional view schematically illustrating a light emitting device for plant growth, according to an embodiment.

FIG. 4 is a cross-sectional view schematically illustrating a light emitting device for plant growth, according to an embodiment.

Referring to FIG. 4, a light emitting device 100B for plant growth according to the present embodiment may be understood as being similar to the light emitting device 100A illustrated in FIG. 1, except that one wavelength conversion material 154', instead of the first and second wavelength conversion materials 154 and 156, is used, and a blue LED chip 130' is mounted in a flip chip manner. In addition, components of the present embodiment may be understood by referring to the description for the same or similar components, unless otherwise mentioned.

The blue LED chip 130' may be connected to the lead frames 111 and 112 in a flip-chip manner. In the previous embodiment, the lead frames 111 and 112 are electrically connected to the blue LED chip 130 by the conductive wire 180, but the blue LED chip 130' employed in the present embodiment may be directly connected to the lead frames 111 and 112 using a conductive bump (not shown) in the case in which the blue LED chip 130' has a flip chip structure. In this manner, the LED chip employable in the light emitting device according to the present embodiment may have various connection structures.

Similar to the previous embodiment, the LED chip 130' employed in the present embodiment may be configured to emit an excitation light having a peak wavelength in the range of 380 nm to 445 nm. In some embodiments, the peak wavelength of the LED chip 130 may be in the range of 430 nm to 445 nm, and in certain embodiments, it may be in a lower range of 430 nm to 440 nm.

The wavelength conversion unit 150B employed in the present embodiment may include one wavelength conversion material 154'. The wavelength conversion material 154' may be configured to emit a converted light having a peak wavelength ranging from 500 nm to 610 nm. For example, the wavelength conversion material 154' may include a phosphor selected from among ((Ga,Gd,Y,Lu)$_3$Al$_5$O$_{12}$:Ce, La$_3$Si$_6$N$_{11}$:Ce, (Sr,Ca,Ba)Si$_2$O$_2$N$_2$:Eu, (Sr,Ba)$_2$SiO$_4$:Eu, (Sr,Ca)AlSiN$_3$:Eu, (Lu,Gd,Y)$_3$(Ga,Al)$_5$O$_{12}$:Ce, and β-SiAlON:Eu.

A PPE of the light emitting device 100B for plant growth according to the present embodiment may be 3.10 µmol/J or more. The light emitted from the light emitting device 100B for plant growth may be located in a rectangular region defined by (0.22, 0.29), (0.35, 0.29), (0.5, 0.43), and (0.32, 0.55) shown in FIG. 3. In addition, the light from the light emitting device 100B for plant growth may have a color temperature in the range of 1,800K to 10,000K, and in some embodiments, it may be in the range of 4,000K to 5,500K. Meanwhile, a CRI of the emitted light may be relatively low as 75 or less.

Figure 5:
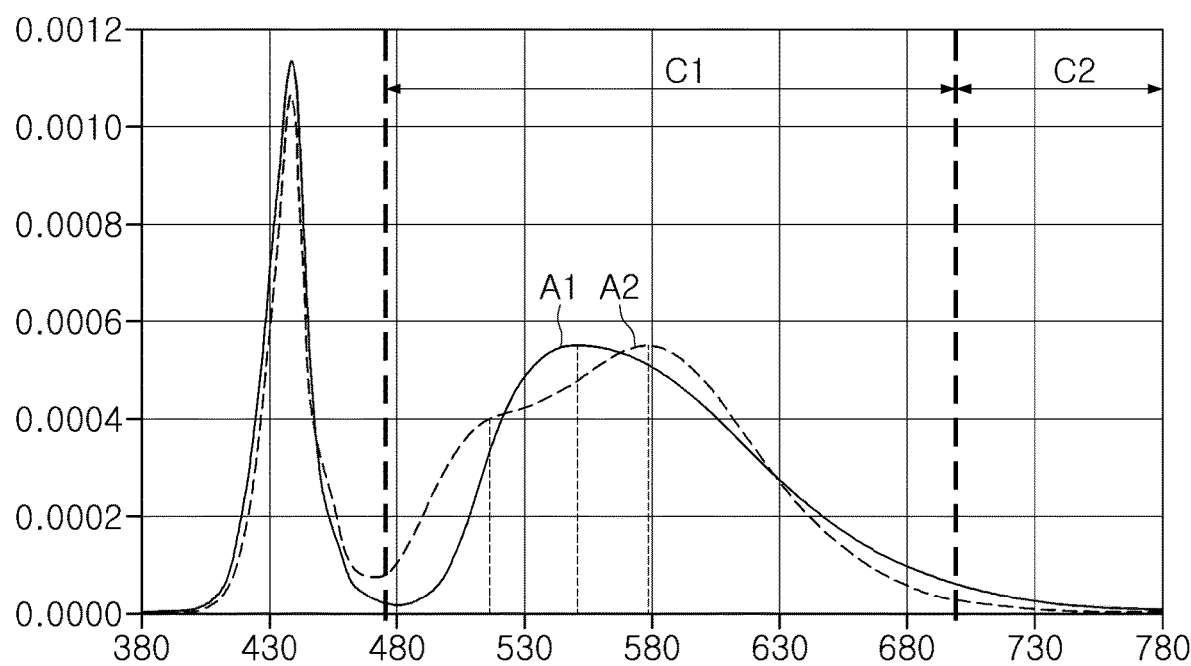
FIG. 5 illustrates emission spectra of light emitting devices, according to embodiments.

FIG. 5 illustrates emission spectra of light emitting devices according to embodiments.

Referring to FIG. 5, a first example in which a spectrum A1 of a light is emitted from a light emitting device similar to the light emitting device 100B of FIG. 4 is compared with a second example in which a spectrum A2 of a light is emitted from a light emitting device similar to the light emitting device 100A of FIG. 1.

The light emitting devices for plant growth according to the first and second examples combines different combinations of wavelength conversion materials as follows to emit a white light having the same color temperature, while using the same 435 nm LED chip.

A1: Phosphor alone having a 564 nm peak wavelength
A2: Phosphor having a 535 nm peak wavelength and phosphor having a 599 nm peak wavelength Referring to FIG. 5, a converted light of white lights A1 and A2 according to both embodiments is mostly (C1) distributed in the PAR region (e.g., 480 nm to 700 nm) that contributes to the growth of plants, which are photosynthetic organisms, and distributed at a very low level in a wavelength band of 700 nm or more (C2). For example, a relative intensity at 700 nm may be 10% or less of a maximum peak of the converted light band. In addition, second highest peaks (or second peaks) lower than the highest peaks (or first peaks) based on the excitation light source were 550 nm and 580 nm, respectively. As such, since the second peaks are located in the range of 500 nm to 600 nm, each white light may have a sufficient PPF.

Both white lights according to the two embodiments may have an improved PPE of 3.10 µmol/J or more through shortening of the wavelength of excitation light but may have a low CRI of 75 or less, unlike general lighting.

Theoretically, since the light emitting device according to the first example uses a phosphor having a peak wavelength of 560 nm to 565 nm, it was expected that the amount of phosphor used would be reduced compared to that of the second example, but in actual evaluation (e.g., @5000K), the amount of the phosphor used in the second Example was less than that of the first Example by percent by weight, and the second example was evaluated to be more improved in terms of PPE. This result is judged to be caused by a relatively low internal quantum efficiency (IQE) of the phosphor employed in the first example or a large loss in the emission spectrum out of the PAR region. Therefore, if a 560 nm to 565 nm phosphor with improved IQE and a half maximum width is developed in the future, even if the phosphor is used alone, the amount of the phosphor used may be reduced and the PPE may be improved, compared with the case (the second example) in which the plurality of wavelength conversion materials are used.

Figure 6:
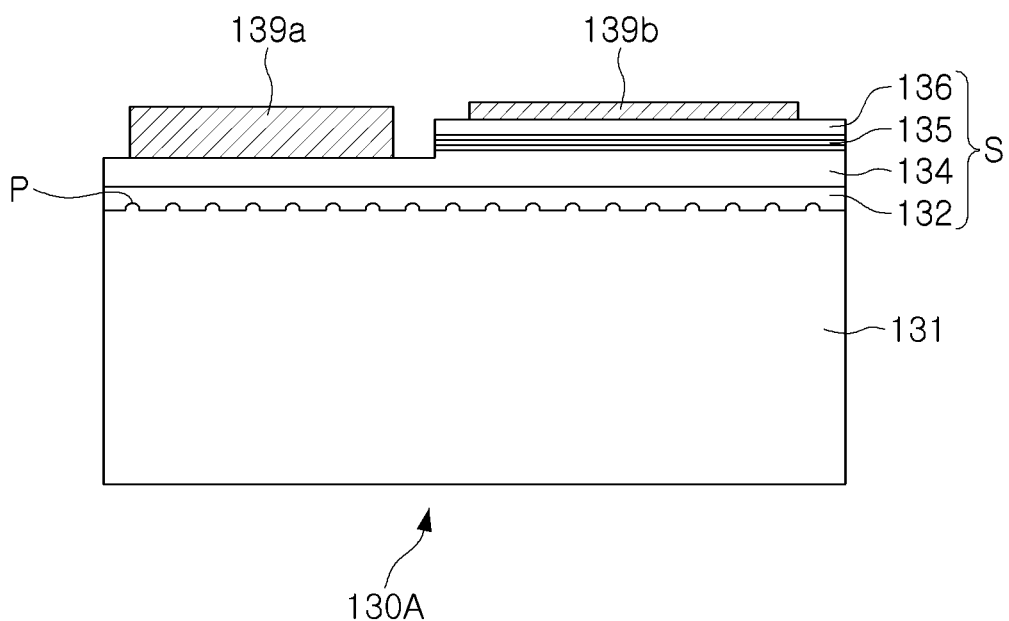
FIGS. 6 and 7 are cross-sectional views illustrating various examples of LED chips employable in a light emitting device for plant growth, according to an embodiment.
Figure 7:
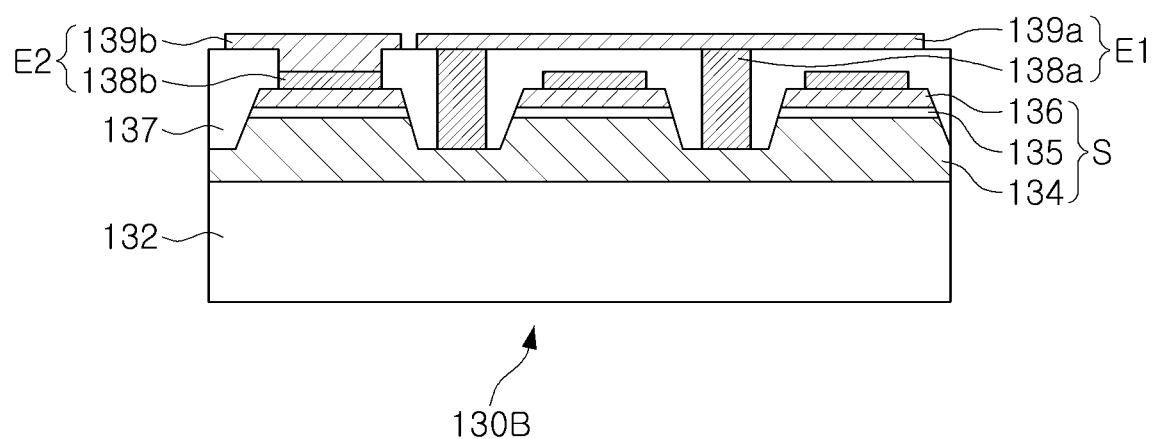

FIGS. 6 and 7 are cross-sectional views illustrating examples of various LED chips employable as LED chips of a light emitting device, according to an embodiment.

Referring to FIG. 6, an LED chip 130A employed in the present embodiment includes a substrate 131 and a semiconductor stack S disposed on the substrate 131. The semiconductor stack S may include a first conductivity-type semiconductor layer 134, an active layer 135, and a second conductivity-type semiconductor layer 136 sequentially disposed on the substrate 131. A buffer layer 132 may be additionally disposed between the substrate 131 and the first conductivity-type semiconductor layer 134.

The substrate 131 may be an insulating substrate such as sapphire. However, the inventive concept is not limited thereto, and the substrate 131 may be a conductive or semiconductor substrate as well as the insulating substrate. For example, the substrate 131 may be formed of SiC, Si, $MgAl_2O_4$, MgO, $LiAlO_2$, and $LiGaO_2$, GaN in addition to sapphire. Concavities and convexities P may be formed on an upper surface of the substrate 131. The concavities and convexities P may improve quality of a grown single crystal, while improving light extraction efficiency.

The buffer layer 132 may be $In_xAl_yGa_{1-x-y}N$ ($0 \leq x \leq 1$, $0 \leq y \leq 1$). For example, the buffer layer 132 may be GaN, AlN, AlGaN, or InGaN. If necessary, a plurality of layers may be combined or a composition thereof may be gradually changed to be used.

The first conductivity-type semiconductor layer 134 may be a nitride semiconductor satisfying n-type $InxAlyGa1-x-yN$ ($0 \leq x \leq 1$, $0 \leq y \leq 1$, $0 \leq x+y < 1$), and an n-type impurity may be Si. For example, the first conductivity-type semiconductor layer 134 may include n-type GaN. The second conductivity-type semiconductor layer 136 may be a nitride semiconductor layer satisfying p-type $In_xAl_yGa_{1-x-y}N$ ($0 \leq x \leq 1$, $0 \leq y \leq 1$, $0 \leq x+y < 1$), and a p-type impurity may be Mg. For example, the second conductivity-type semiconductor layer 136 may be implemented as a single-layer structure or may have a multi-layer structure having different compositions as in this example.

The active layer 135 may have a multi-quantum well (MQW) structure in which quantum well layers and quantum barrier layers are alternately stacked with each other. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 \leq x \leq 1$), and the quantum barrier layer may be GaN or AlGaN. A thickness of the quantum well layer and the quantum barrier layer may be in the range of 1 nm to 50 nm.

First and second electrodes 139a and 139b may be located on a mesa-etched region of the conductivity-type semiconductor layer 134 and on the second conductivity-type semiconductor 136, respectively, so as to be coplanar (first surface). The first electrode 139a may include a material such as Ag, Ni, Al, Cr, Rh, Pd, Ir, Ru, Mg, Zn, Pt, Au, and the like, and may include a structure including a single layer or a double or more layers, but is not limited thereto. In some embodiments, the second electrode 139b may be a transparent electrode such as a transparent conductive oxide or a transparent conductive nitride or may include graphene. The second electrode 139b may include at least one of Al, Au, Cr, Ni, Ti, and Sn.

Referring to FIG. 7, an LED chip 130B according to the present embodiment may be understood as being similar to the LED chip 130A shown in FIG. 6, except for an electrode structure and a related structure thereof. The description of the components of the present embodiment may refer to the description of the components the same as or similar to the LED chip 130A shown in FIG. 6 unless otherwise specified.

The LED chip 130B includes first and second electrode structures E1 and E2 connected to the first and second conductivity-type semiconductor layers 134 and 136, respectively. The first electrode structure E1 may include a connection electrode portion 138a connected to the first conductivity-type semiconductor layer 134 through the second conductivity-type semiconductor layer 136 and the active layer 135, and a first electrode pad 139a connected to the connection electrode portion 138a. The connection electrode portion 138a may be a structure such as a conductive via. The connection electrode portion 138a may be surrounded by an insulating portion 137 so as to be electrically separated from the active layer 135 and the second conductivity-type semiconductor layer 136. The connection electrode portion 138a may be disposed in a region in which the semiconductor stack S is etched. The number, shape, pitches, or a contact area of the connection electrode portion 138a with the first conductivity-type semiconductor layer 134 may be appropriately designed so that contact resistance is reduced. In addition, the connection electrode portion 138a may be arranged to form rows and columns on the semiconductor stack S, thereby improving current flow. The second electrode structure E2 may include an ohmic contact layer 138b and a second electrode pad 139b on the second conductivity-type semiconductor layer 136.

The connection electrode portion 138a and the ohmic contact layer 138b may include a single layer or a multilayer structure formed of a conductive material having ohmic characteristics with respect to the first and second conductivity-type semiconductor layers 134 and 136, respectively. The connection electrode portion 138a and the ohmic contact layer 138b may include at least one of, for example, a metal such as Ag, Al, Ni, Cr and a transparent conductive oxide (TCO) such as ITO.

The first and second electrode pads 139a and 139b may be respectively connected to the connection electrode portion 138a and the ohmic contact layer 138b to function as external terminals of the LED chip 130B. For example, the first and second electrode pads 139a and 139b may be Au, Ag, Al, Ti, W, Cu, Sn, Ni, Pt, Cr, NiSn, TiW, AuSn, or an eutectic metal thereof.

The first and second electrode structures E1 and E2 may be disposed in the same direction as each other and may be connected to an external terminal (e.g., lead frame) by a wire or may be mounted on the lead frame in a so-called flip chip manner. In the case of flip-chip mounting, the insulating portion 137 may have a multilayer reflective structure in which a plurality of insulating layers having different refractive indices are alternately stacked. For example, the multilayer reflective structure may be a distributed Bragg reflector (DBR) in which a first insulating film having a first refractive index and a second insulating film having a second refractive index are alternately stacked.

The light emitting device employable in the present embodiment is described through the embodiments 100A and 100B described above in reference to FIGS. 1 and 4, respectively, but may have various other package structures than the described structures. For example, the sidewall reflector 120 may not be employed. In some embodiments, the wavelength conversion units 150A and 150B may be provided as films formed of at least a portion of the wavelength conversion material.

As described above, the LED chips 130A and 130B employed in the present embodiment may include the active layer 135 configured to emit an excitation light having a relatively short wavelength. The wavelength of the excitation light may be in the range of 380 nm to 445 nm, furthermore, in the range of 430 nm to 445 nm. In some embodiments, it may be in the lower range of 430 nm to 440 nm.

Figure 8:
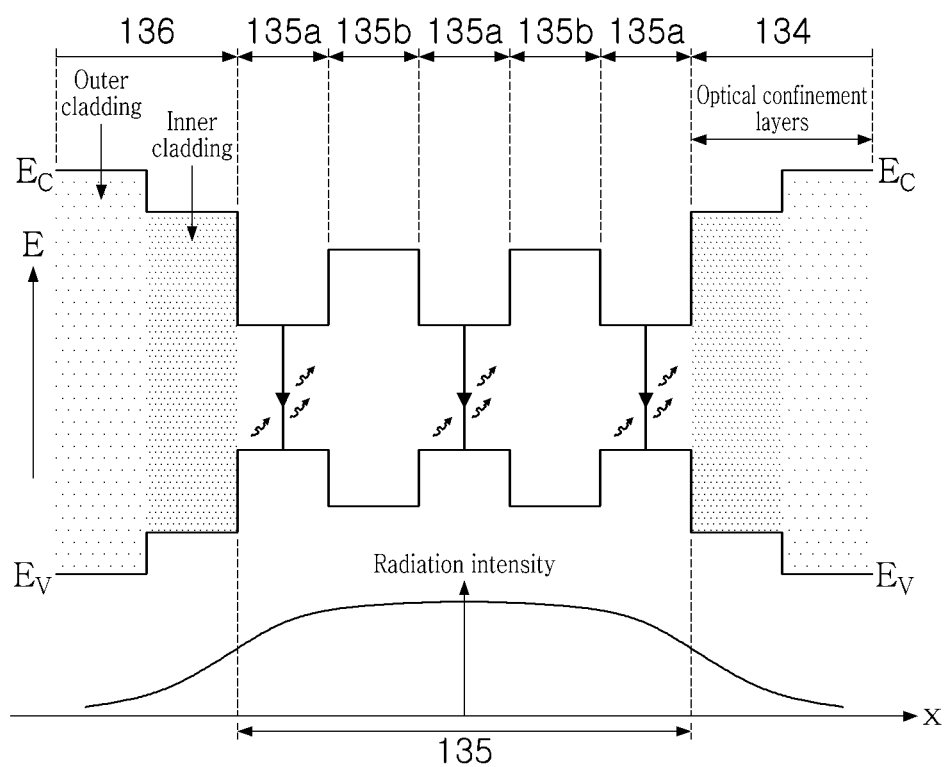
FIG. 8 illustrates a bandgap diagram of an active layer region introduced into an LED chip, according to an embodiment.

The LED chip may have a multi-quantum well structure in which an InGaN quantum well layer 135a and a GaN quantum barrier layer 135b are alternately stacked as shown in FIG. 8. FIG. 8 may be understood as a bandgap diagram illustrating the active layer 135 of the multi-quantum well structure and some regions therearound in the LED chips shown in FIGS. 6 and 7.

The high-efficiency short wavelength required in the present embodiment may be realized by reducing the indium content. For inGaN/GaN grown on a C-plane, that is, the (0001) plane, of the sapphire substrate, dislocation may occur due to lattice mismatch at an interface, which may reduce a radiation recombination efficiency, and thus, it is preferable, but not necessary, to reduce the indium content from the viewpoint of improving the efficiency. Therefore, the LED chip employed in the present embodiment may emit a light having a peak wavelength having a region lower than that of the general blue LED chip, that is, 445 nm or less, furthermore, 440 nm or less to thereby improve an efficiency.

However, excessive reduction of the indium content may rather reduce the efficiency.

In the multi-quantum well structure shown in FIG. 8, since a band gap of the quantum well layer 135a increases as the indium content decreases, the effect of the barrier structure may be reduced. In order to maintain the band gap difference between the quantum barrier and the quantum well, the GaN/InGaN structure should be replaced with an AlGaN/GaN structure. However, if replaced, a luminous efficiency may rather be reduced due to a change in (e.g., an increase in the bandgap of the electron blocking layer) the overall semiconductor epitaxial structure. In addition, since the "ohmic contact" is difficult at the electrode contact portion due to the increase automatically in the band gap, a forward voltage may increase to resultantly reduce a light output efficiency compared with input power. Therefore, from the viewpoint of an overall efficiency, the LED chip employed in the present embodiment may improve an efficiency by emitting a light having a peak wavelength of 380 nm or more, and further, 430 nm or less.

As such, when the LED chip employed in the present embodiment is configured to have light having a peak wavelength in the 430 nm to 440 nm region, a luminous efficiency may be significantly improved.

Meanwhile, a high level of indium composition may exacerbate a droop phenomenon.

Specifically, an increase in the indium content may increase compressive stress at the InGaN/GaN interface, and thus piezoelectric polarization may intensify. When the forward voltage is applied, an electrical field may be generated in proportion to the polarity of the piezoelectric field, and thus an inclination of the quantum well is changed to increase by the electric field, thereby reducing radiation recombination efficiency.

Figure 9:
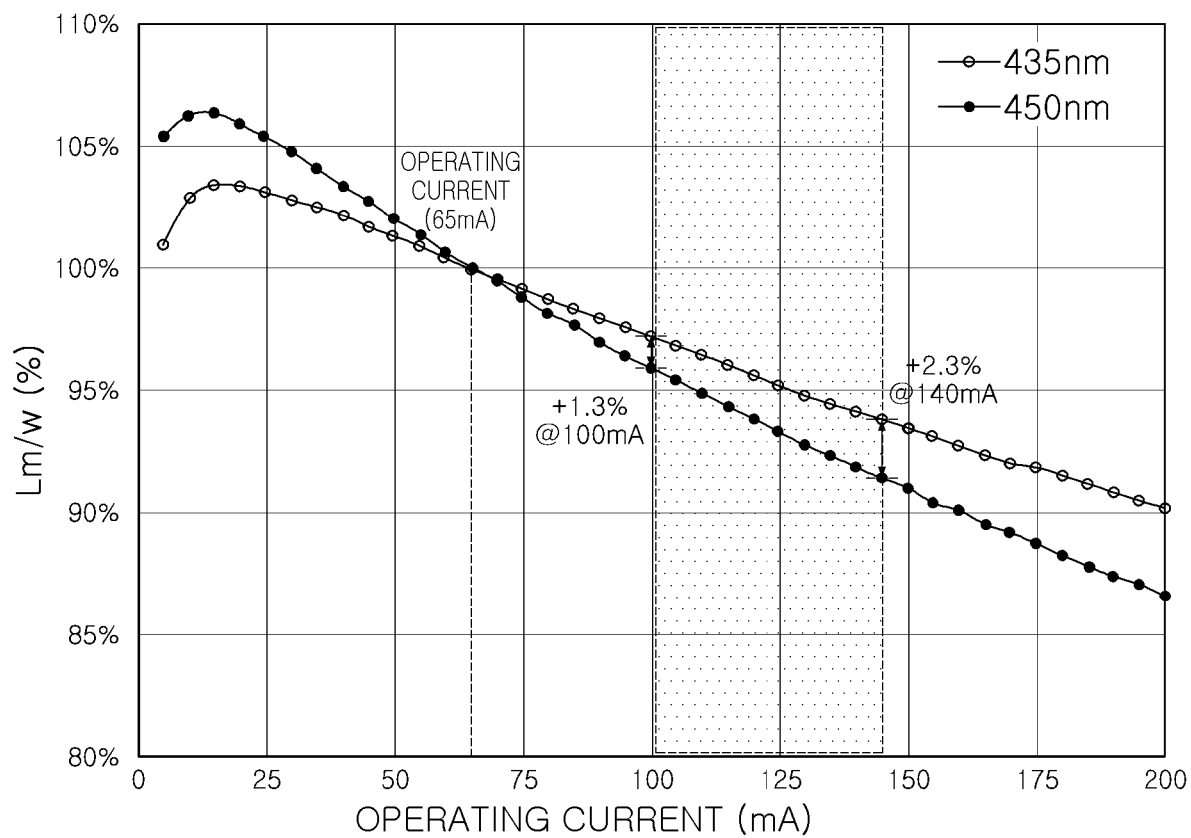
FIG. 9 is a graph illustrating an effect of improving the droop (droop) when a high-efficiency short-wavelength LED chip is applied.

FIG. 9 is a graph illustrating a droop improvement effect when a high-efficiency short-wavelength LED chip is applied, according to an embodiment.

Referring to FIG. 9, an LED chip emitting light having a wavelength of 435 nm (hereinafter, an LED chip having a wavelength of 435 nm) shows a change in power output according to an operating current of an LED chip (hereinafter, an LED chip having a wavelength of 455 nm) emitting a light having a wavelength of 450 nm. It can be seen that, when an operating current is 65 mA or less, the LED chip having a wavelength of 455 nm has power higher than that of the LED chip having a wavelength of 435 nm, but in an operating current higher than 65 mA, the LED chip having a wavelength of 435 nm is higher. In particular, it can be seen that, in 100 mA to 140 mA corresponding to a general driving region, power of the LED chip having a wavelength of 435 nm is improved by 1.3% to 2.3% or more than the power of the LED chip having a wavelength of 455 nm.

As such, by lowering the indium content in an appropriate range, the droop phenomenon of the LED chip may be improved, and a high efficiency may be obtained. Such an improvement effect may be understood to be greatly affected by an increase in a radiant flux rather than by an increase in the band gap of the quantum well layer 135a due to a decrease in the indium content, and wall plug efficiency is improved.

In order to verify an appropriate short wavelength range of the LED chip employed in the present embodiment, a sample of a light emitting device was manufactured by combining an LED chip emitting a light from 410 nm to 450 nm (change in units of 10 nm) by changing an indium content, a phosphor having a peak wavelength of 535 nm and a phosphor having a peak wavelength of 599 nm to emit a white light of 5000 K.

Figure 10:
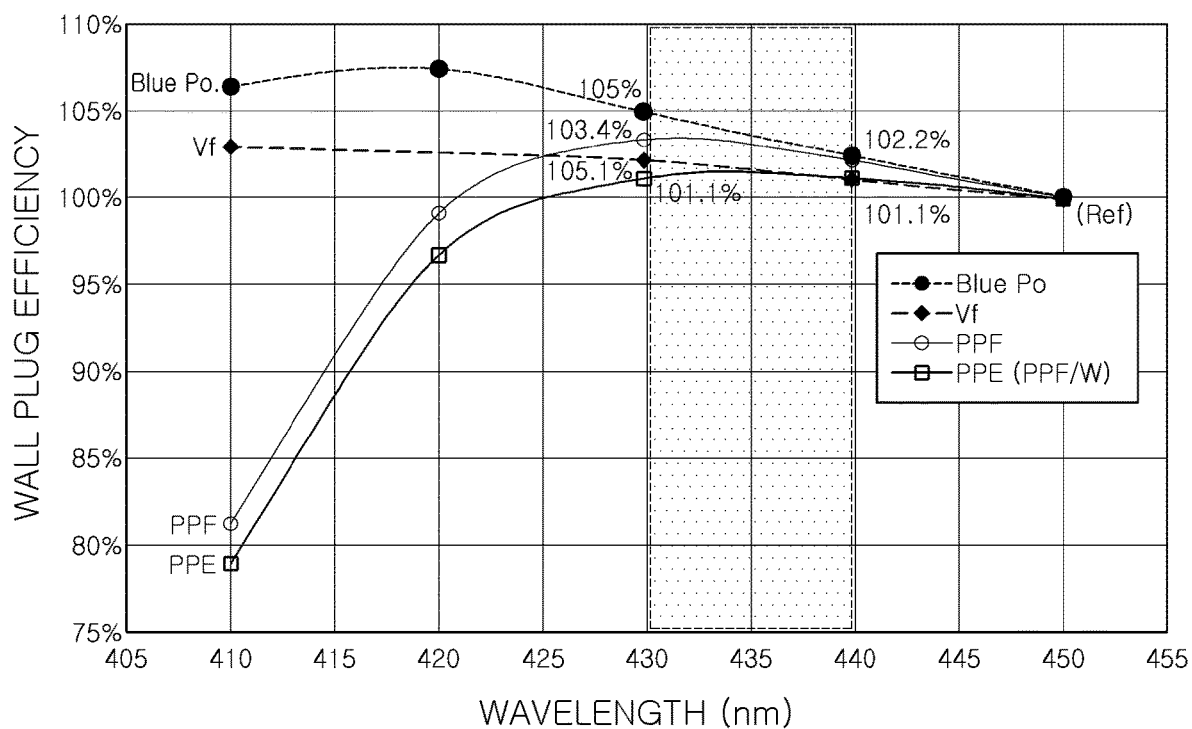
FIG. 10 is a graph illustrating wall plug efficiency according to wavelengths.

FIG. 10 is a graph illustrating wall plug efficiency according to emission wavelength, according to an embodiment.

Referring to FIG. 10, based on a sample of 450 nm as a reference value (Ref), i.e., 100%, characteristics of each sample (410 nm, 420 nm, 430 nm, and 440 nm) were measured and shown.

Specifically, an efficiency (Blue Po) of a blue LED chip tends to generally increase in a short wavelength band and slightly decrease in a long wavelength band. Similarly, a constant voltage Vf may gradually decrease in a long wavelength band under a condition of maintaining high power.

Meanwhile, the PPF was maintained higher than the reference value in the short wavelength section up to a sample of 420 nm, and PPF of the sample 410 nm rapidly decreased to about 80% level. The rapid decrease may be understood as a result of the reduction in photosynthetic effective. Similarly, it can be seen that the PPE is slightly decreased from the 420 nm sample, but is improved.

As such, according to the results of FIG. 10, it is can be seen that the PPE is significantly improved than a reference value in a section where the wavelength of the LED chip is 425 nm to 445 nm, particularly, in a section of 430 nm to 440 nm.

The LED chip includes a nitride semiconductor stack having a quantum well layer, and when the quantum well layer is expressed as $In_xGa_{1-x}N$, an indium composition ratio of the quantum well layer for a wavelength range of 430 nm to 440 nm may satisfy a range of $0.112 \leq x \leq 0.130$.

Specifically, a principle of improving photosynthetic photon efficiency through shortening of an excitation light wavelength may be described in more detail in relation to a wavelength conversion material.

Figure 11:
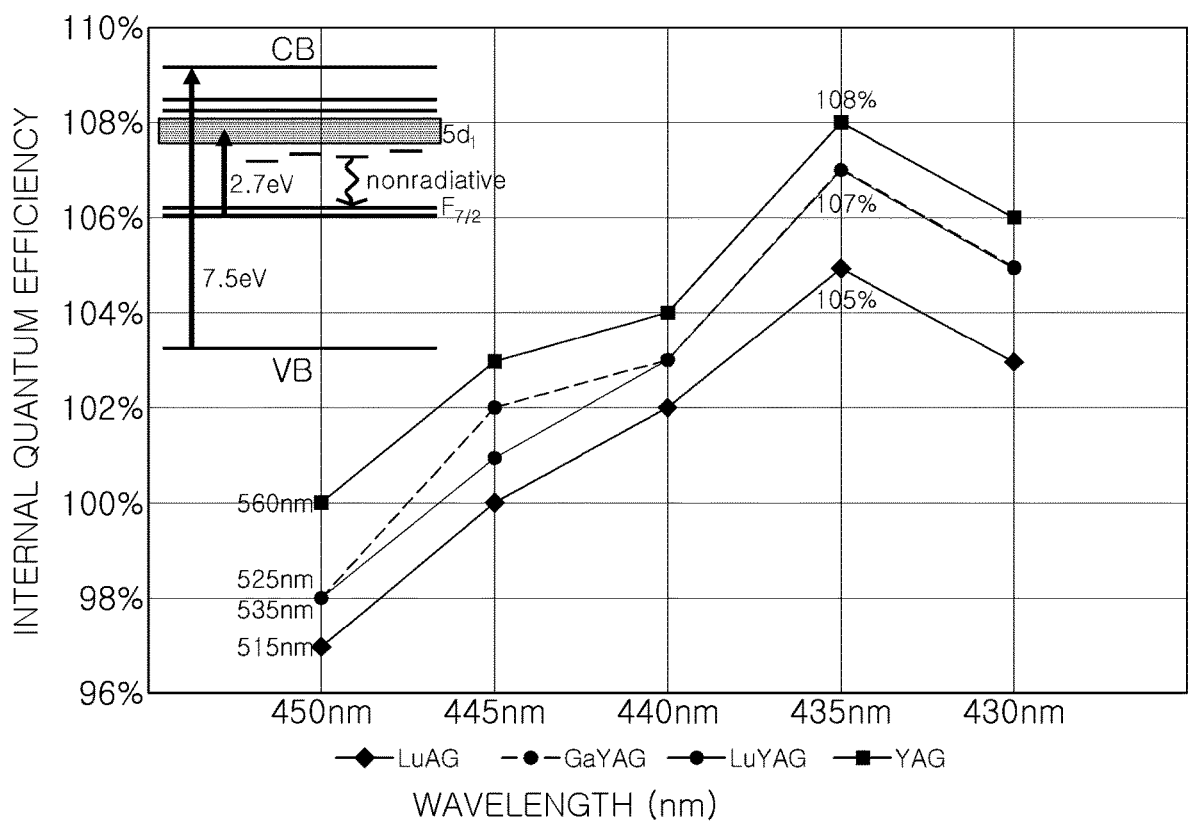
FIG. 11 is a graph illustrating a change in internal quantum efficiency (IEQ) of wavelength conversion materials according to shortening of an excitation wavelength.

FIG. 11 is a graph illustrating a change in internal quantum efficiency of wavelength conversion materials according to shortening of an excitation wavelength, according to an embodiment.

Referring to FIG. 11, changes of an internal quantum efficiency (or wavelength conversion efficiency) of phosphors that may be advantageously employed in the present embodiment according to a wavelength of an excitation light source. Here, the phosphors are $Lu_3Al_5O_{12}$:Ce (LuAG, 515 nm), $Y_3(Ga,Al)_5O_{12}$:Ce (GaYAG, 525 nm), $(Lu,Y)_3Al_5O_{12}$:Ce (LuYAG, 535 nm), $Y_3Al_5O_{12}$:Ce (YAG, 560 nm). In the case of these example phosphors, it can be seen that an efficiency was relatively large in an excitation light having a generally lower wavelength than in an excitation light having a wavelength of 450 nm and was maximized at 435 nm. It can be seen that an excellent efficiency can be obtained when the excitation light of the LED chip has as mentioned above has a wavelength of 430 nm to 440 nm.

As described above, since photons based on shortening of a wavelength have a relatively high energy level, a non-radiative recombination probability due to defects of wavelength conversion materials (phosphors) is reduced, and thus, a conversion efficiency of the wavelength conversion materials themselves may be significantly improved. In addition, it is possible to provide a phosphor converting a light having a peak wavelength of 500 nm to 610 nm may be provided using $(Lu,Gd,Y)_3(Ga,Al)_5O_{12}$:Ce.

In addition to these effects, an effect of substantially improving an efficiency by reducing an amount of phosphor used. A decrease in the amount of phosphor used in a same color coordinate standard may be explained by the tristimulus value. The center of a Z-bar curve, which mainly corresponds to blue, is 450 nm, and the Z ratio may be reduced according to shortening of the spectrum. Specifically, the color coordinates are calculated as Cx=X/(X+Y+Z), Cy=Y(X+Y+Z), and X and Y need to be reduced at the same ratio according to the reduction in the Z ratio to maintain the color coordinates.

Figure 12:
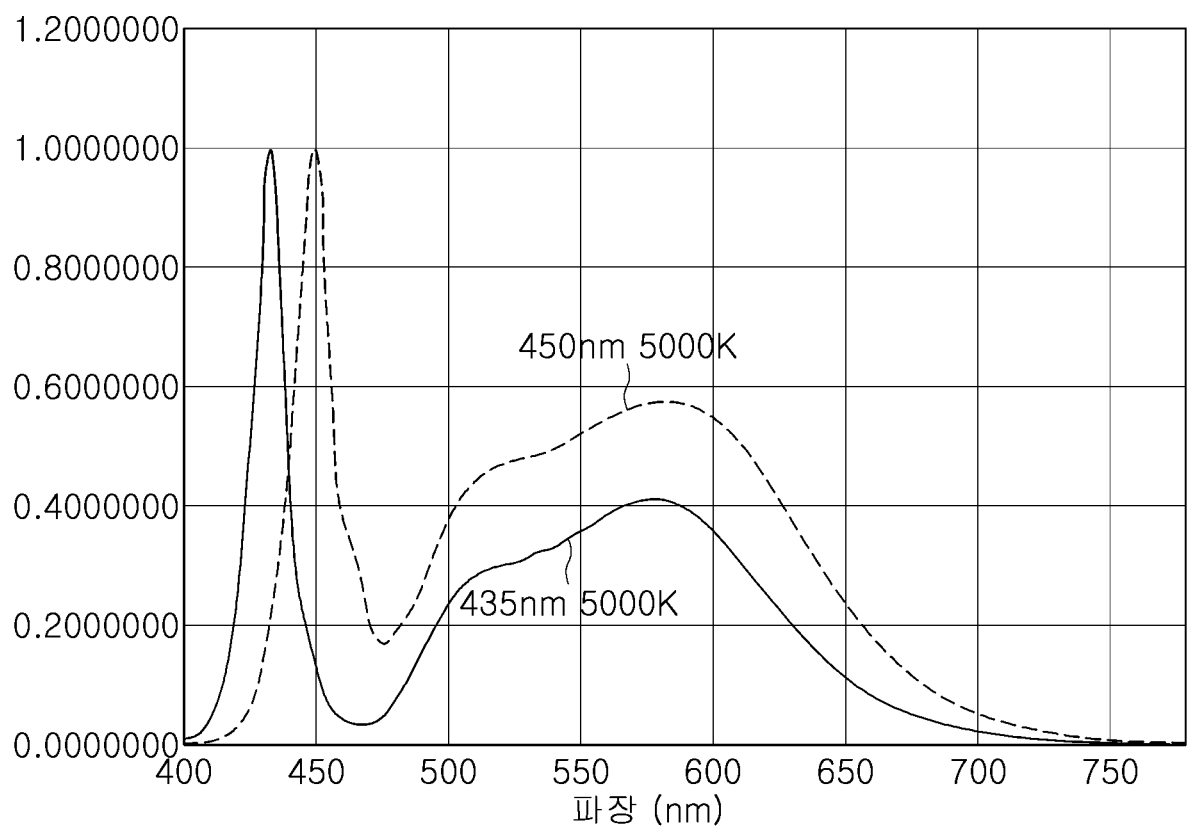
FIG. 12 is a graph illustrating changes in the emission spectrum according to shortening of an excitation wavelength.

In an experimental example, two light emitting devices are provided for obtaining the same color coordinates having a color temperature of 5,000K using a combination of a 535 nm phosphor and a 599 nm phosphor together with a 435 nm LED chip or a 450 nm LED chip. FIG. 12 illustrates spectra of a white light emitted from two light emitting devices.

An amount of phosphors used to obtain a white light having the same color temperature were measured and percents by weight of the measured phosphors is shown in Table 1.

TABLE 1

| Classification | Wavelength | | | Percent by weight of phosphors (based on Comparative Example) |
|---|---|---|---|---|
| | LED chip | First phosphor | Second phosphor | |
| Embodiment Example | 435 nm | 535 nm | 599 nm | 60-75% |
| Comparative Example | 450 nm | 535 nm | 599 nm | 100% |

As described above, due to the change in color coordinates according to the shortening of the wavelength, the amount of the wavelength conversion material required for a light having the same color coordinate (or color temperature) may be significantly reduced. As a result, a loss due to scattering in the wavelength conversion unit 150A is reduced and light transmittance is increased, thereby improving a substantial light efficiency.

In the previous embodiment, as the wavelength conversion material, a wavelength conversion material (e.g., red phosphor) emitting a light having a different wavelength may be additionally included in addition to at least one wavelength conversion material for emitting a light having a peak wavelength of 500 nm to 610 nm. Such an embodiment is shown in FIG. 4.

Figure 13:
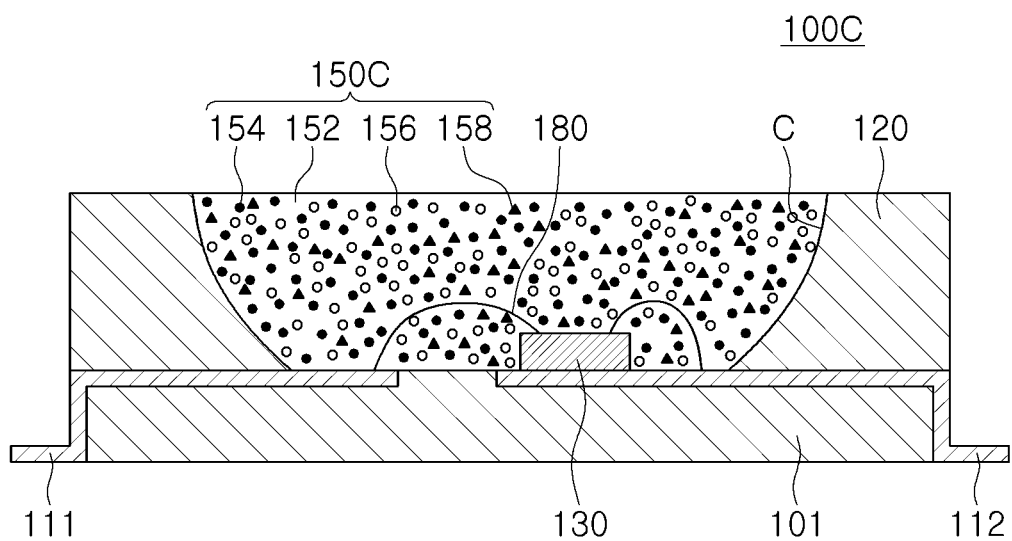
FIG. 13 is a cross-sectional view schematically illustrating a light emitting device for plant growth according to an embodiment.

FIG. 13 is a cross-sectional view schematically illustrating a light emitting device for plant growth, according to an embodiment.

Referring to FIG. 13, a light emitting device 100C for plant growth according to the present embodiment may be understood as being similar to the light emitting device 100A illustrated in FIG. 1, except for the use of a third wavelength conversion material 158 in addition to the first and second wavelength conversion materials 154 and 156. In addition, the components of the present embodiment may be understood with reference to descriptions of the same or similar components of the light emitting device 100A shown in FIG. 1 unless otherwise specified.

The LED chip 130 employed in the present embodiment may be configured to emit an excitation light having a peak wavelength in a range of 380 nm to 445 nm, similarly to the previous embodiment. In some embodiments, the peak wavelength of the LED chip 130 may be in a range of 430 nm to 445 nm, and in some embodiments, it may be in a lower range of 430 nm to 440 nm.

The wavelength conversion material employed in the present embodiment may include a first wavelength conversion material 154 configured to convert an excitation light into a first light having a peak wavelength ranging from 500 nm to 550 nm, a second wavelength conversion material 156 configured to convert the excitation light into a second light having a peak wavelength ranging from 570 nm to 610 nm, and a third wavelength conversion material 158 configured to convert the excitation light into a third light having a peak wavelength ranging from 610 nm to 680 nm. The third wavelength conversion material may include a phosphor selected from $(Sr,Ca)AlSiN_3$:Eu, $K_xSiF_y$:$Mn^{4+}$ ($2 \leq x \leq 3$, $4 \leq y \leq 7$).

The light emitting device 100C for plant growth shown in FIG. 13 may combine the lights converted by the first to third wavelength conversion materials 154, 156, and 158 and an unconverted portion of the excitation light and emit a white light for plant growth as an output light. The PPE of the light emitting device 100C for plant growth according to the present embodiment may be 3.10 μmol/J or more. The light emitted from the light emitting device 100B for plant growth may be located in a rectangular region defined by (0.22, 0.29), (0.35, 0.29), (0.5, 0.43), and (0.32, 0.55) in a CIE 1931 coordinate system (see FIG. 3).

In an additional experimental example, a plurality of light emitting devices emitting a light having a desired color temperature were manufactured by combining phosphor(s) corresponding to Table 2 below together with LED chips B1, B2, B3, and B4 having a peak wavelength of 437 nm corresponding to the conditions of the embodiments herein. At least one of $Lu_3Al_5O_{12}$:Ce and Ga-YAG was used as a first phosphor (peak wavelength: 535 nm), and as a second phosphor (599 nm) and a third phosphor (620 nm), (Sr,Ca)$AlSiN_3$:Eu in which Sr/Ca ratios are different were used. However, Example B4 (see Table 2 below) used only one type of phosphor (the first phosphor) and manufactured to emit a mint-based light, rather than a white light, unlike other examples.

The light emitting device according to Comparative Example C was manufactured by combining an LED chip having a peak wavelength of 452 nm and first to third phosphors to have a same color temperature (5000K) as that of Example B1.

TABLE 2

| Example | LED chip peak wavelength | Wt % of components of wavelength conversion unit | | | | Color temperature |
|---|---|---|---|---|---|---|
| | | Silicone resin | First phosphor (535 nm) | Second phosphor (599 nm) | Third phosphor (620 nm) | |
| B1 | 437 nm | 81.5 | 15.8 | 2.7 | | 5000 K |
| B2 | 437 nm | 77.3 | 18.4 | 4.3 | | 4000 K |
| B3 | 437 nm | 72.2 | 20.3 | 7.5 | | 3000 K |
| B4 | 437 nm | 83.3 | 16.7 | | | (Mint) |
| C | 452 nm | 72.2 | 26.5 | 0.5 | 0.9 | 5000 K |

PPE values were measured together with the color coordinates of each of Examples B1 to B4 and Comparative Example C, and results are shown in Table 3 below. As shown in Table 3, all of the color coordinates of light according to Examples B1 to B4 correspond to the color coordinate region WR shown in FIG. 3, and in particular, the PPE value has a high value of 3 μmol/J or more, while, in the case of Comparative Example C, the PPE value was generally low as 2.98 to 3.05 μmol/J.

TABLE 3

| Classification | Color temperature | Cx | Cy | PPE (μmol/J) |
|---|---|---|---|---|
| B1 | 5000 K | 0.3447 | 0.3553 | 3.15-3.25 |
| B2 | 4000 K | 0.3818 | 0.3797 | 3.15-3.25 |
| B3 | 3000 K | 0.4338 | 0.403 | 3.10-3.20 |
| B4 | (Mint) | 0.2755 | 0.334 | 3.15-3.30 |
| C | 5000 K | 0.3447 | 0.3553 | 2.98-3.05 |

Figure 14:
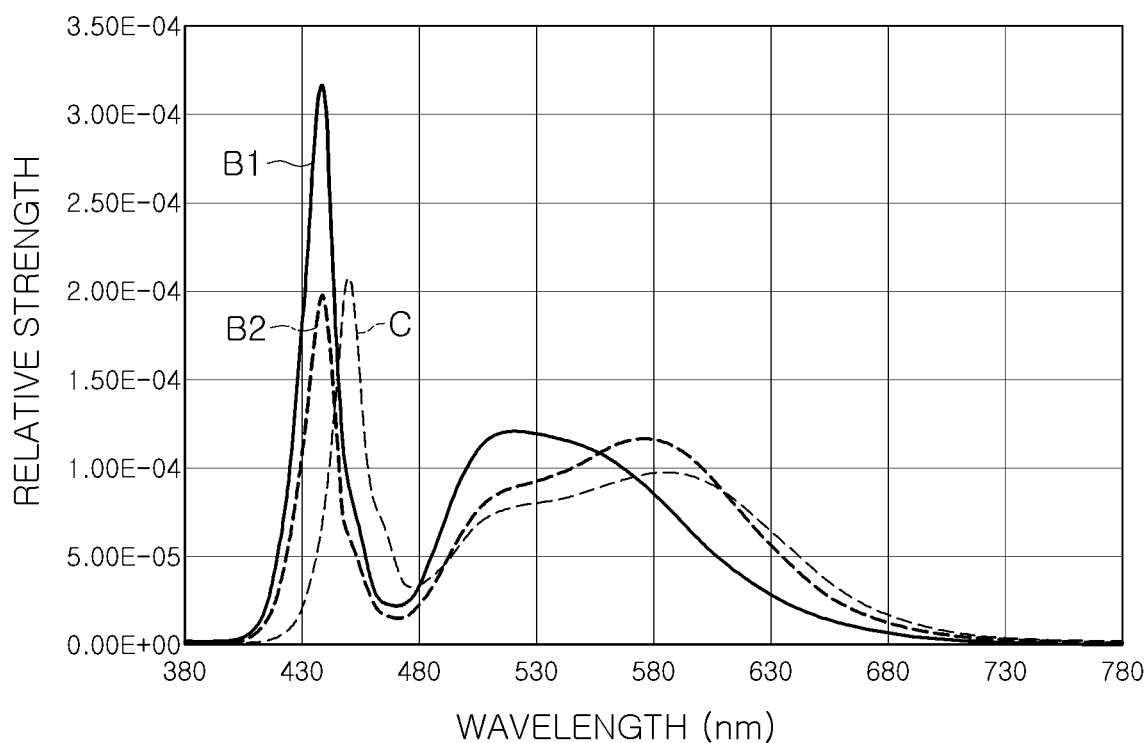
FIG. 14 is a graph illustrating emission spectra of light emitting devices for plant growth according to various embodiments.

Referring to FIG. 14, the spectra of the light according to some Examples B1 and B4 and the light according to Comparative Example C are shown. Most of the converted light is distributed in the PAR region (e.g., 480 nm to 700 nm) that contributes to the growth of plants, which are photosynthetic organisms, but in the case of C, light appears in the wavelength band of 700 nm or more. As confirmed in Table 3 above, the light according to two Examples (B1, B4) may have an improved PPE of 3.10 μmol/J or more through shortening of the wavelength of the excitation light, but Comparative Example C using a 452 nm LED chip had a relatively low PPE (e.g., less than 3.10 μmol/J) due to low phosphor conversion efficiency and phosphor usage.

Further, Example B1 and Comparative Example C are configured to emit a white light having the same color temperature and the same color coordinates, but there is a significant difference in the amount of phosphor used. As shown in Table 2 above, the percent by weight of the phosphor used in Comparative Example C was 27.8 wt % based on the weight of the wavelength conversion unit, whereas the percent by weight of the phosphor used in Example B1 was 18.5 wt %, and thus, the usage of the phosphor was reduced to about 67% compared to Comparative Example C emitting the same white light.

Figure 15:
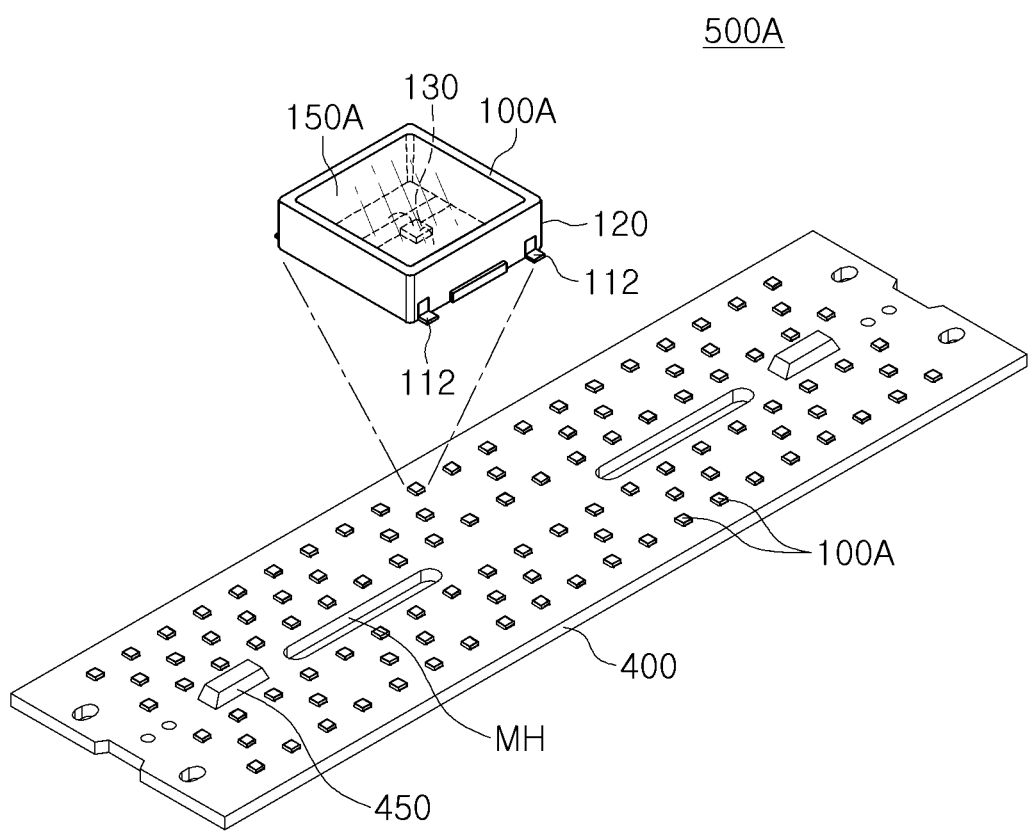
FIG. 15 is a schematic perspective view illustrating a light apparatus for plant growth according to an embodiment.

FIG. 15 is a schematic perspective view illustrating a light apparatus for plant growth, according to an embodiment.

Referring to FIG. 15, a light apparatus 500A according to the present embodiment includes a plurality of light emitting devices 110A and a circuit board 400 on which the plurality of light emitting devices are mounted in a plurality of rows.

The plurality of light emitting devices 100A is not limited to the light emitting device shown in FIG. 1, and may be a light emitting device according to another embodiment. The circuit board 400 may be, for example, a metal core printed circuit board. The circuit board 400 may include a slot-shaped mounting hole MH and a protruding connector 450. The mounting hole MH may be used as a mounting hole for installing the light apparatus 500A, and the connector 450 may be connected to an external power supply device so as to be provided as a connection unit for supplying power to the plurality of light emitting devices 100A.

Figure 16:
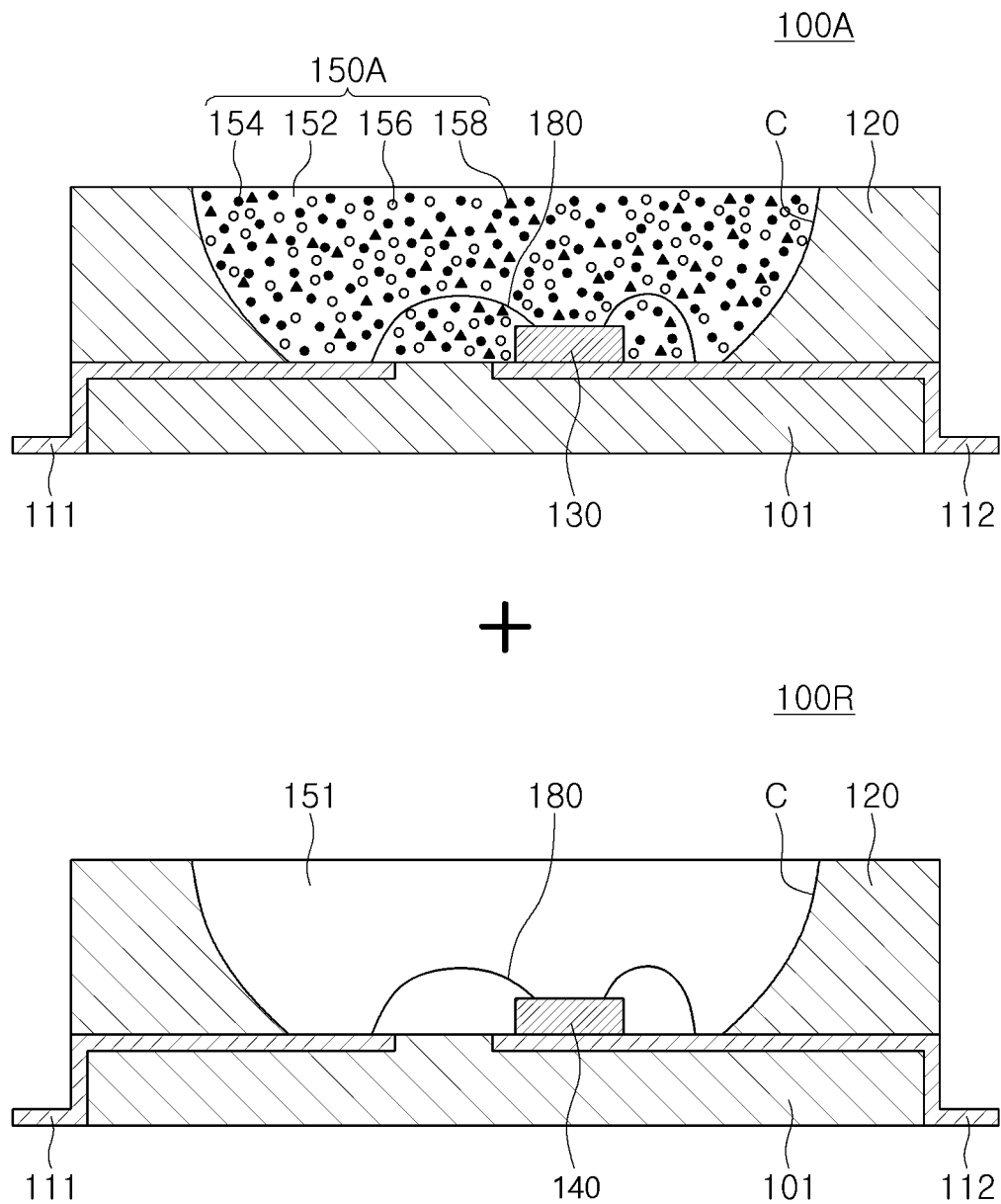
FIG. 16 is a cross-sectional view illustrating a light emitting device for plant growth according to an embodiment.

FIG. 16 is a cross-sectional view illustrating a light emitting device for plant growth, according to an embodiment.

Referring to FIG. 16, the light emitting device according to the present embodiment may include a first light emitting device 100A configured to emit a white light, and a second light emitting device 100R configured to emit a light having a peak wavelength of 600 nm to 750 nm. Unlike the example shown in FIG. 13, a separate red LED chip 140 may be configured as a separate package from the first light emitting device 100A, and may be employed at a light apparatus level. According to the present embodiment, a color temperature of an appropriate output light may be changed by combining a red light but it may not affect an intrinsic photosynthetic photon efficiency of the first light emitting device 100A.

Figure 17:
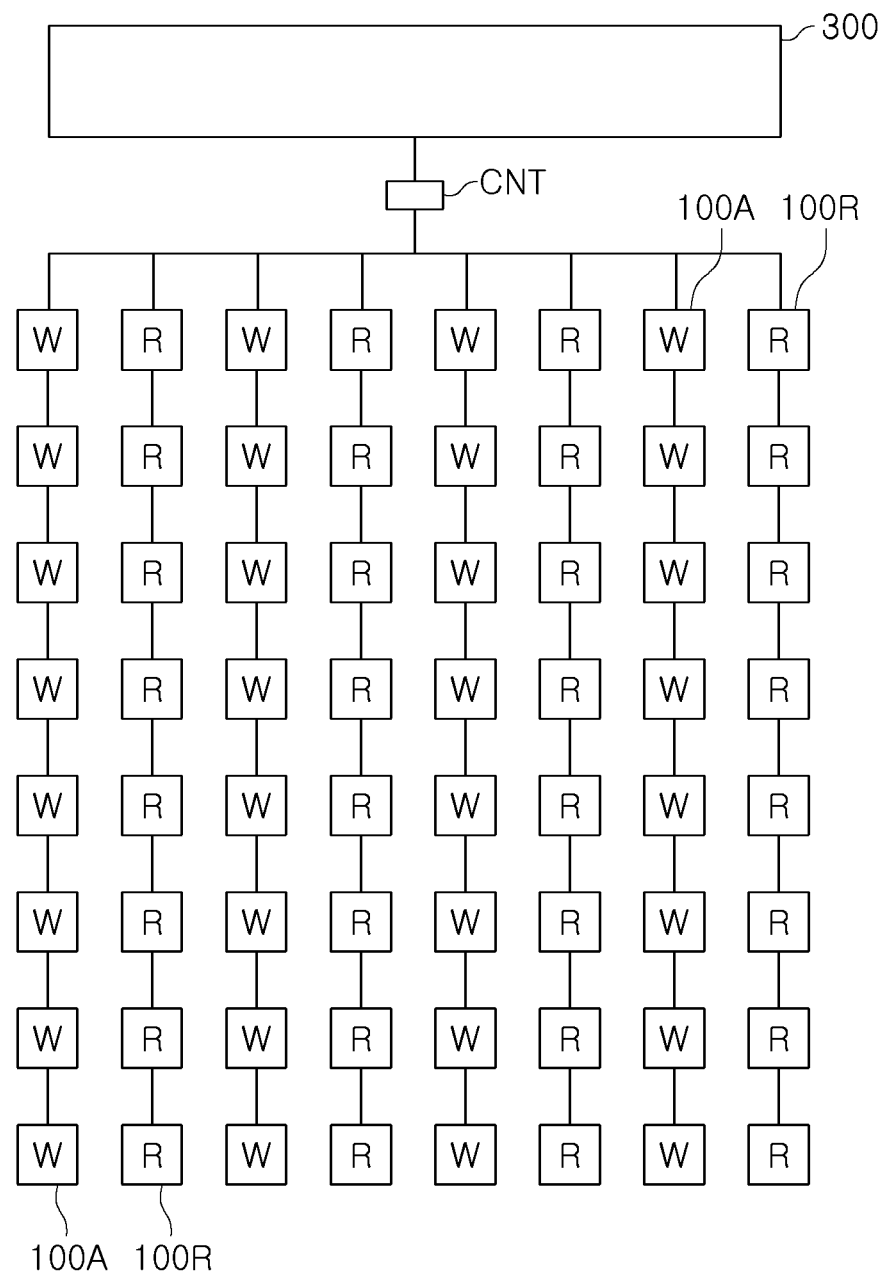
FIGS. 17 and 18 are a schematic block diagram and a plan view of a light apparatus for plant growth according to an embodiment.
Figure 18:
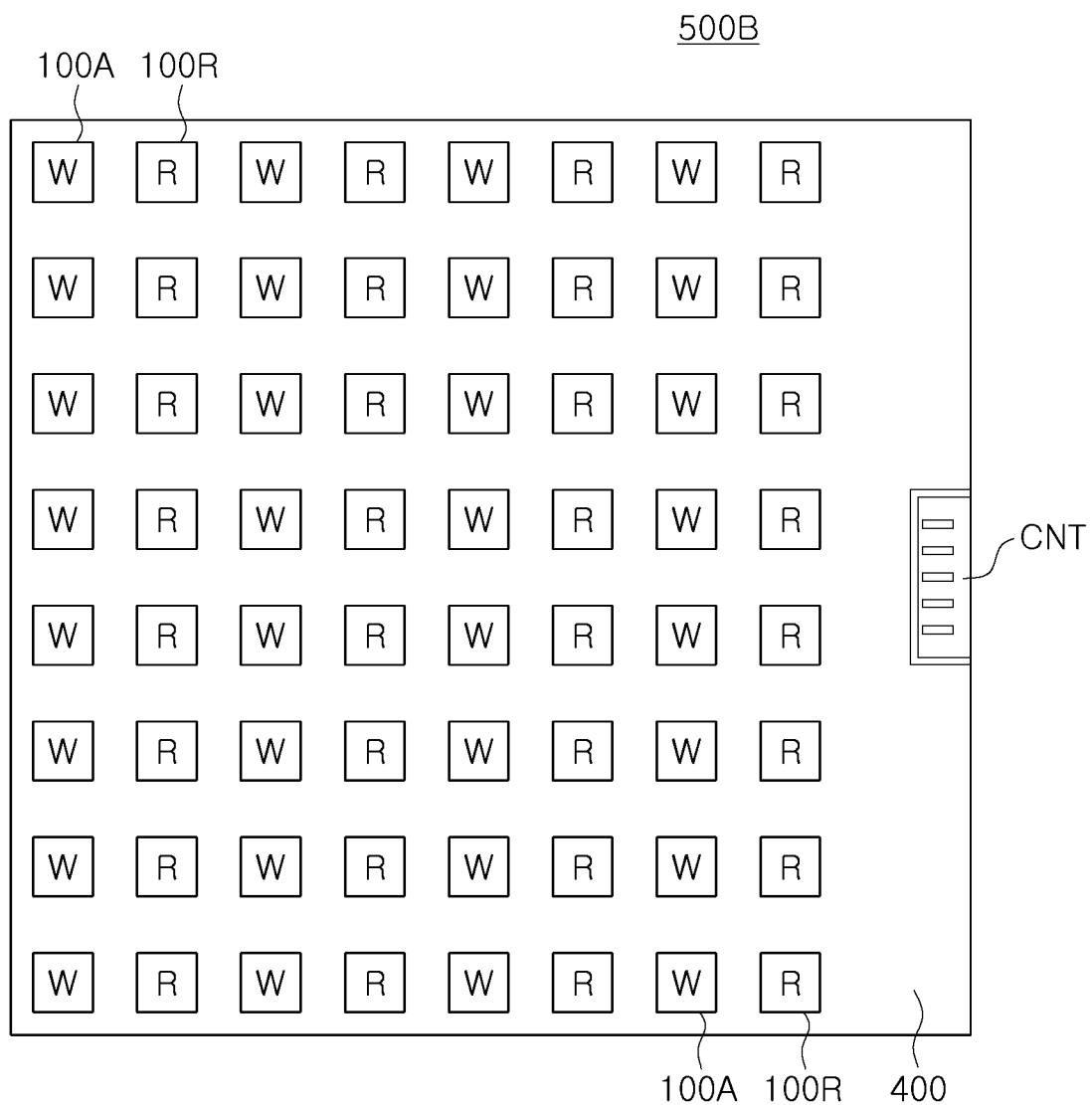

FIGS. 17 and 18 are a schematic block diagram and a plan view of a light apparatus for plant growth, according to an embodiment.

Referring to FIGS. 17 and 18, a light emitting module 500B according to the present embodiment may include a circuit board 400 and a plurality of first and second light emitting devices 100A and 100R mounted on the circuit board 400.

The plurality of first light emitting devices 100A may be configured to provide a light of an emission spectrum suitable for growth of plants, which are photosynthetic organisms, as described above with reference to FIGS. 1 to 3. The first light emitting device 100A may increase the PPE to 3.10 μmol/J or more by shortening a wavelength of a light from the LED chip, which is an excitation light source. An excitation light of the LED chip may have a peak wavelength in a range of 380 nm to 445 nm, furthermore, 430 nm to 440 nm. Meanwhile, a white light emitted from the first light emitting device 100A may have a low CRI of 75 or less, unlike general lighting. A light emitted from the first light emitting device may be located in a rectangular region defined by (0.22, 0.29), (0.35, 0.29), (0.5, 0.43) and (0.32, 0.55) in the CIE 1931 coordinate system.

The second light emitting device 100R may be configured to emit a red light having a peak wavelength of 600 nm to 750 nm, as described above with reference to FIG. 16. For example, the second light emitting device 100R may be configured as a package including only a red LED chip without a separate wavelength conversion unit. However, the inventive concept is not limited thereto, and the plurality of second light emitting devices 100R may be configured to emit a white light of different colors or different color temperatures.

FIG. 18 is a plan view schematically illustrating the light apparatus 500B described in FIG. 17. The light apparatus 500B illustrated in FIG. 18 includes a plurality of strings connected in series to each of the plurality of first and second light emitting devices 100A and 100R, respectively, and arranged in parallel with each other. The light apparatus 500B illustrated in FIG. 18 may be connected to a DC driver 300 through an interconnection portion CNT provided on one side of the substrate 400. The DC driver 300 may be configured to independently drive each power of the plurality of first light emitting devices 100A and the plurality of second light emitting devices 100R. Thus, each power may be independently adjusted to provide an appropriate light according to a plant type.

As set forth above, the light emitting device and the light apparatus according to the embodiments may provide light for plant growth with improved light transmittance in terms of a photosynthetic efficiency, while satisfying the condition of an absorption spectrum for plant growth.

While example embodiments have been shown and described above, it will be apparent to those skilled in the art that modifications and variations could be made without departing from the scope of the inventive concept as defined by the appended claims.

What is claimed is:

1. A light emitting device for plant growth comprising:
   a light emitting diode (LED) chip configured to emit a first light having a peak wavelength of 430 nm to 445 nm, wherein the LED chip comprises a nitride semiconductor stack having a quantum well layer and a quantum barrier layer, the quantum well layer comprises InxGa1-xN, wherein 0.112≤x≤0.130, and the quantum barrier layer comprises GaN;
   a first wavelength conversion material configured to be excited by the first light, and emit a second light having a peak wavelength of 500 nm to 550 nm; and
   a second wavelength conversion material configured to be excited by the first light, and emit a third light having a peak wavelength ranging from 570 nm to 610 nm,
   wherein a photosynthetic photon efficacy (PPE) of an output light emitted from the light emitting device is 3.10 μmol/J or more.

2. The light emitting device of claim 1, wherein at least one of the first wavelength conversion material and the second wavelength conversion material comprises a phosphor selected from a group consisting of (Ga,Gd,Y,Lu)3Al5O12:Ce, La3Si6N11:Ce, (Sr,Ca,Ba)Si2O2N2:Eu, (Sr,Ba)2SiO4:Eu, (Sr,Ca)AlSiN3:Eu, (Lu,Gd,Y)3(Ga,Al)5O12:Ce, or β-SiAlON:Eu.

3. The light emitting device of claim 1, wherein the output light emitted from the light emitting device has color coordinates located in a region defined by (0.22, 0.29), (0.35, 0.29), (0.5, 0.43), and (0.32, 0.55) in a CIE 1931 color coordinate system.

4. The light emitting device of claim 1, wherein a color rendering index of the output light emitted from the light emitting device is 75 or less.

5. The light emitting device of claim 1, wherein a color temperature of the output light emitted from the light emitting device ranges from 4000K to 5500K or less.

6. The light emitting device of claim 1, further comprising a third wavelength conversion material configured to convert the first light into a fourth light having a peak wavelength of 610 nm to 680 nm.

7. The light emitting device of claim 6, wherein the third wavelength conversion material comprises a phosphor selected from a group consisting of (Sr,Ca)AlSiN3:Eu, KxSiFy:Mn4+(2≤x≤3, 4≤y≤7) and a combination thereof.

8. The light emitting device of claim 1, further comprising a red LED chip configured to emit a fourth light having a peak wavelength of 600 nm to 750 nm.

9. A light apparatus for plant growth, the light apparatus comprising:
   a circuit board; and
   a plurality of light emitting devices mounted on the circuit board,
   wherein each of the plurality of light emitting devices comprises:
   a light emitting diode (LED) chip configured to emit a first light having a peak wavelength of 430 nm to 445 nm, wherein the LED chip comprises a nitride semiconductor stack having a quantum well layer and a quantum barrier layer, the quantum well layer comprises InxGa1-xN, wherein 0.112≤x≤0.130, and the quantum barrier layer comprises GaN;
   a first wavelength conversion material configured to be excited by the first light, and emit a second light having a peak wavelength of 500 nm to 550 nm, and
   a second wavelength conversion material configured to be excited by the first light, and emit a third light having a peak wavelength ranging from 570 nm to 610 nm,
   wherein a photosynthetic photon efficacy (PPE) of an output light emitted from each of the plurality of light emitting devices is 3.10 μmol/J or more.

10. The light apparatus of claim 9, wherein at least one of the first wavelength conversion material and the second wavelength conversion material comprises (Ga,Gd,Y,Lu)3Al5O12:Ce.

11. The light apparatus of claim 9, wherein the output light emitted from each of the plurality of light emitting devices has color coordinates located in a region defined by (0.22, 0.29), (0.35, 0.29), (0.5, 0.43), and (0.32, 0.55) in a CIE 1931 color coordinate system.

12. The light apparatus of claim 9, wherein the plurality of light emitting devices further comprise at least one additional light emitting device configured to emit a light having a spectrum different from that of a light emitted from each of the plurality of light emitting devices.

* * * * *